United States Patent [19]

Yamada et al.

[11] Patent Number: 5,536,704
[45] Date of Patent: Jul. 16, 1996

[54] COMPOSITE MATERIAL AND METHOD OF PREPARING SAME

[75] Inventors: Yasuji Yamada, Tokyo; Minoru Tagami, Funabashi; Masaru Nakamura, Mitaka; Hideki Sakai, Urawa; Koichi Uehara, Tokyo; Yuh Shiohara, Chigasaki; Shoji Tanaka, Tokyo, all of Japan

[73] Assignees: International Superconductivity Technology Center; Mitsubishi Cable Industries, Ltd.; Kyocera Corporation; Japan Energy Corporation, all of, Japan

[21] Appl. No.: 240,067

[22] Filed: May 9, 1994

[30] Foreign Application Priority Data

May 10, 1993 [JP] Japan ................... 5-108569

[51] Int. Cl.6 .................................. C30B 19/02
[52] U.S. Cl. .................... 505/450; 505/451; 505/729; 117/73
[58] Field of Search ................... 505/451, 729, 505/450; 117/73, 749

[56] References Cited

U.S. PATENT DOCUMENTS

| | | | |
|---|---|---|---|
| 5,055,445 | 10/1991 | Belt et al. | 117/23 |
| 5,057,487 | 10/1991 | Parker et al. | 505/1 |
| 5,057,492 | 10/1991 | Oka et al. | 505/451 |
| 5,162,297 | 11/1992 | Terashima et al. | 505/451 |
| 5,407,907 | 4/1995 | Yamada et al. | 505/451 |
| 5,409,892 | 4/1995 | Hayashi et al. | 505/451 |

FOREIGN PATENT DOCUMENTS

| | | |
|---|---|---|
| 2262519 | 6/1993 | United Kingdom . |
| A9004857 | 5/1990 | WIPO . |
| A9119026 | 12/1991 | WIPO . |

OTHER PUBLICATIONS

Japanese Journal of Applied Physics vol. 28, No. 8, Aug. 1989 pp. 1417–1420.

*Primary Examiner*—Robert Kunemund
*Attorney, Agent, or Firm*—Lorusso & Loud

[57] ABSTRACT

A composite material comprising a bulky substrate of a Y-series 123 metal oxide crystal, and at least one layer provided on a surface of the substrate and formed of a crystal of a Y-series 123 metal oxide. The substrate may be produced by immersing a seed material in a liquid phase which comprises components constituting the metal oxide. The liquid phase contains a solid phase located at a position different from the position at which the seed material contacts the liquid phase. The solid phase provides the liquid phase with solutes which constitute the Y-series 123 metal oxide so that the solutes are transported to the position at which the seed material and the liquid phase contact, thereby permitting the Y-series 123 metal oxide to grow on the seed material as primary crystals and to obtain the bulky substrate. The layer of a Y-series 123 metal oxide may be formed on the substrate by a sputtering method, a vacuum deposition method, a laser abrasion method, a CVD method or a liquid phase epitaxy method.

5 Claims, 3 Drawing Sheets

COMPOSITE MATERIAL AND METHOD OF PREPARING SAME

This invention relates generally to a composite, metal oxide material and, more specifically, to a composite material having a bulky substrate of a Y-series 123 metal oxide and at least layer of a Y-series 123 metal oxide provided on a surface of the substrate. The present invention also provides a method of preparing the above composite material.

A composite, metal oxide material is known which includes a substrate of MgO or $SrTiO_3$ and a thin layer of a Y-series 123 metal oxide formed on the substrate by a sputtering method, a vacuum deposition method, a chemical vapor deposition (CVD) method or a molecular beam epitaxy method. The known composite material has, however, a problem that the crystalinity of the thin layer of a Y-series 123 metal oxide is not good. Thus, the known composite material is ill-suited for the utilization as a superconducting device or a superconducting magnetic shield.

The present invention has been made in view of the foregoing problem of the known composite material.

In accordance with one aspect of the present invention there is provided a composite material comprising a bulky substrate of a Y-series 123 metal oxide crystal, and a layer provided on a surface of said substrate and formed of a crystal of a Y-series 123 metal oxide.

In another aspect, the present invention provides a method of producing the above composite material, comprising the steps of:

contacting a seed material with a liquid phase which contains a melt of a mixture of metal oxides and in which a solid phase is present at a position different from the position at which said seed material and said liquid phase contact, said solid phase providing said liquid phase with solutes which constitute said Y-series 123 metal oxide so that said solutes are transported to the position at which said substrate and said liquid phase contact, thereby permitting said Y-series 123 metal oxide to grow on said seed material as primary crystals and thereby obtaining said substrate; and forming said layer on said substrate.

The present invention will now be described in detail below with reference to the accompanying drawings, in which:

BRIEF DESCRIPTION OF DRAWINGS

Referring to FIG. 1, designated as 10 is a bulky substrate of a Y-series 123 metal oxide.

Figure 1:
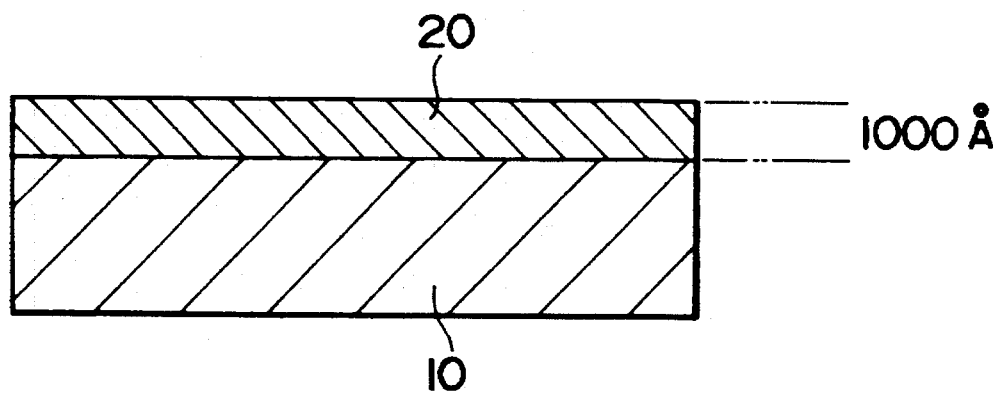
FIG. 1 is a sectional view schematically showing a composite material according to the present invention.

The term "Y-series 123 metal oxide" used in the present specification and claims is intended to refer to a metal oxide having a crystal structure similar to that of $YBa_2Cu_3O_{7-x}$ and having the formula:

$$AB_2Cu_3O_{7-x}$$

wherein A stands for a rare earth element such as Y, Sm, Er, Yb, Pr or a mixture thereof, B stands for an alkaline earth metal such as Ba and x is a number of 0–1.

The term "bulky substrate" used in the present specification and claims is intended to refer to a substrate in the form of a block or a plate. Preferably, the substrate has a thickness of 50 μm or more.

The bulky substrate of a Y-series 123 metal oxide may be suitably obtained by a method including a step of contacting a seed material with a liquid phase which contains a melt of a mixture of metal oxides and in which a solid phase is present at a position different from the position at which the seed material and the liquid phase contact, the solid phase providing the liquid phase with solutes which constitute the Y-series 123 metal oxide so that the solutes are transported to the position at which the substrate and the liquid phase contact, thereby permitting the Y-series 123 metal oxide to grow on the seed material as primary crystals.

The solid phase to be used in the method of the present invention is preferably a Y-series 211 metal oxide.

As the liquid phase, any desired metal oxide mixture may be used. Generally, a melt of a mixture of CuO and BaO is preferably used. A liquid phase consisting of CuO and BaO may be obtained by admixing at least two oxide sources selected from a source of copper oxide, a source of barium oxide and a source of BaCu oxide to form an admixture, the admixture being subsequently heated at a temperature of, for example, 880° C. for 40 hours. In this case, it is desirable that the molar ratio of Ba to Cu should be 3:5 to 3:8.

The solid phase to be used in the above method is preferably a Y-series 211 metal oxide.

The term "Y-series 211 metal oxide" used in the present specification and claims is intended to refer to a metal oxide having the formula:

$$A_2BCuO_{5-x}$$

wherein A, B and x have the same meaning as above.

The weight ratio of the liquid phase to the solid phase is preferably 2–10 parts by weight per part by weight of the solid phase.

As the seed material, it is preferred that a metal oxide having corrosion resistance to the liquid phase be used. Illustrative of suitable seed materials are those formed of $SmBa_2Cu_3O_{7-x}$ crystal, magnesia single crystal and $YBa_2Cu_3O_{7-x}$ crystal.

The solid phase and the liquid phase are contained in a crucible formed of a material which does not react with the liquid phase and which does not adversely affect the properties of the desired metal oxide crystal, such as yttria, magnesia, alumina or stabilized zirconia. The crucible is placed within a furnace or oven. The seed material is immersed in the liquid phase while gradually lowering the temperature of the liquid phase so as to cause the crystal of the desired Y123-series metal oxide to deposit on the seed material and to grow. For the acceleration of the growth of the crystal, the temperature of the liquid phase adjacent to the seed material is made lower by about 20° C. than a temperature at which the crystal of the metal oxide is equilibriously stable. In an alternative, the substrate is slowly pulled up at a rate of 0.01–10 mm per hour.

The thus obtained Y-series 123 metal oxide may be used as such as the substrate of the composite material according to the present invention. If desired, the as obtained metal oxide may be cut and/or ground to a desired shape.

Referring again to FIG. 1, on the bulky substrate 10 is formed at least one layer 20 of a Y-series 123 metal oxide. The thickness of the layer 20 is generally 0.01–10 μm. The layer 20 may be suitably formed by a sputtering method, a vacuum deposition method, a laser abrasion method, a CVD method or a liquid phase epitaxy method. If desired, one or more additional layers of a Y-series 123 metal oxide may be laminated over the layer 20.

The following examples will further illustrate the present invention.

EXAMPLE 1

Preparation of Bulky Substrate:

Into a yttria crucible having an inside diameter of 50 mm and a height of 50 mm were charged $Y_2BaCuO_5$ (solid phase) and a calcined mass obtained by calcining a mixture of barium carbonate and copper oxide (a molar ratio of Ba/Cu of 3:5) at 880° C. for 40 hours. The crucible was placed inside of a furnace and the contents in the crucible was heated so as to create such a temperature gradient that the bottom was 1,100° C. while the was 1,080° C. After lowering the temperature of the contents in the crucible to a bottom temperature of 1,015° C. and a surface temperature of 1,000° C., a seed material of $SmBa_2Cu_3O_{7-x}$ crystal (about 1 g, 10 mm x 3 mm x 3 mm) was immersed into the melt in the crucible and then continuously pulled up at a rate of 0.2 mm per hour for about 50 hours while being rotated at 100 revolutions per minute (rpm), whereby a single crystal of $YBa_2Cu_3O_{7-x}$ was allowed to grow on the seed crystal bar as primary crystal.

Preparation of Composite Material:

Using the single crystal of $YBa_2Cu_3O_{7-x}$ obtained above as a substrate, a composite material was prepared. Thus, on the ac plane of the substrate was formed a thin layer (about 0.1 μm thick) of $YBa_2Cu_3O_{7-x}$ by a CVD method. The X-ray diffraction pattern of the thus formed thin layer is shown in FIG. 2.

For the purpose of comparison, a composite material was prepared in the same manner as described above except that a strontium titanate substrate was substituted for the bulky Y-series 123 metal oxide substrate. The X-ray diffraction pattern of the thin layer of the comparative sample is shown in FIG. 3.

Figure 2:
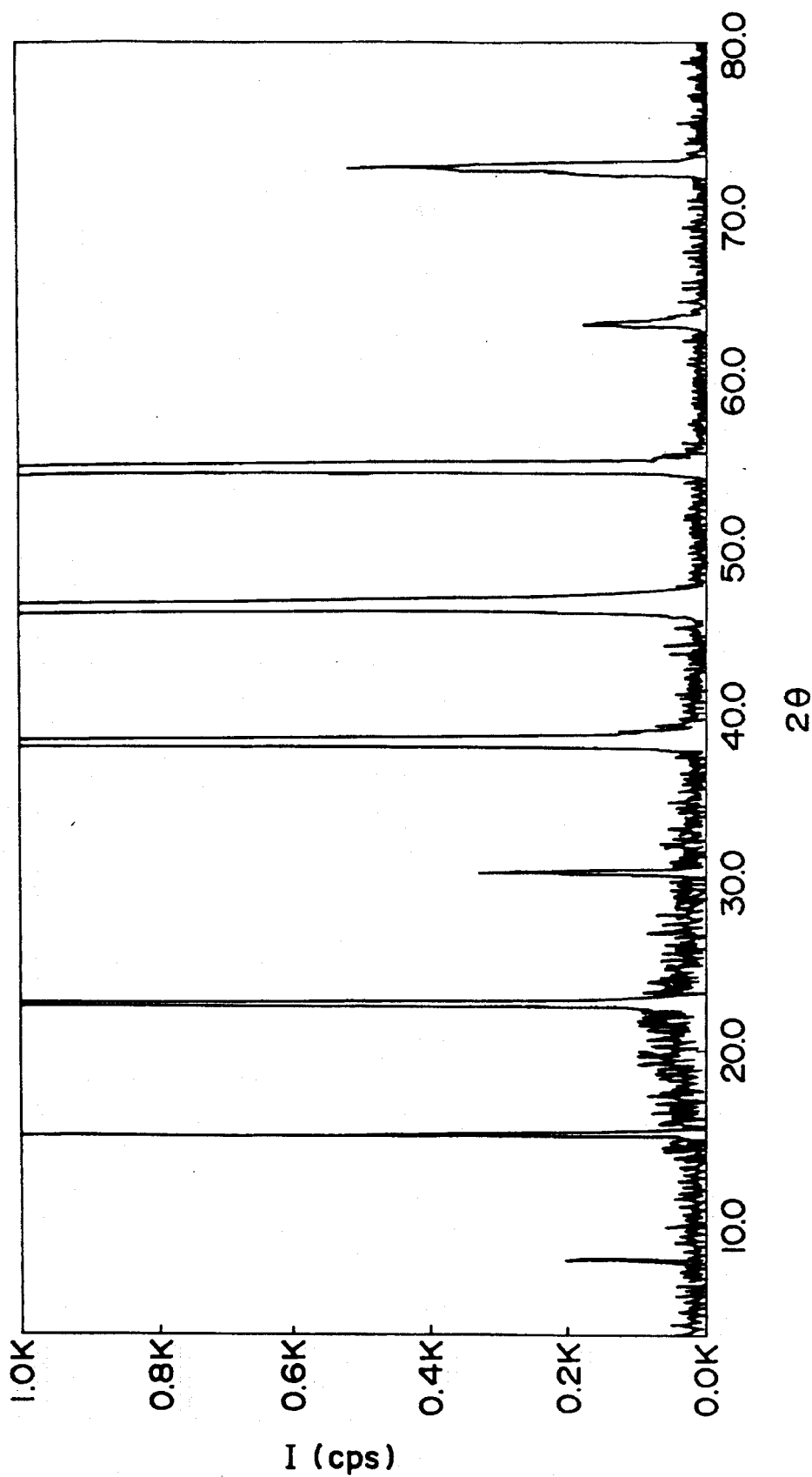
FIG. 2 is an X-ray diffraction pattern of a metal oxide layer obtained in Example 1 according to the present invention.
Figure 3:
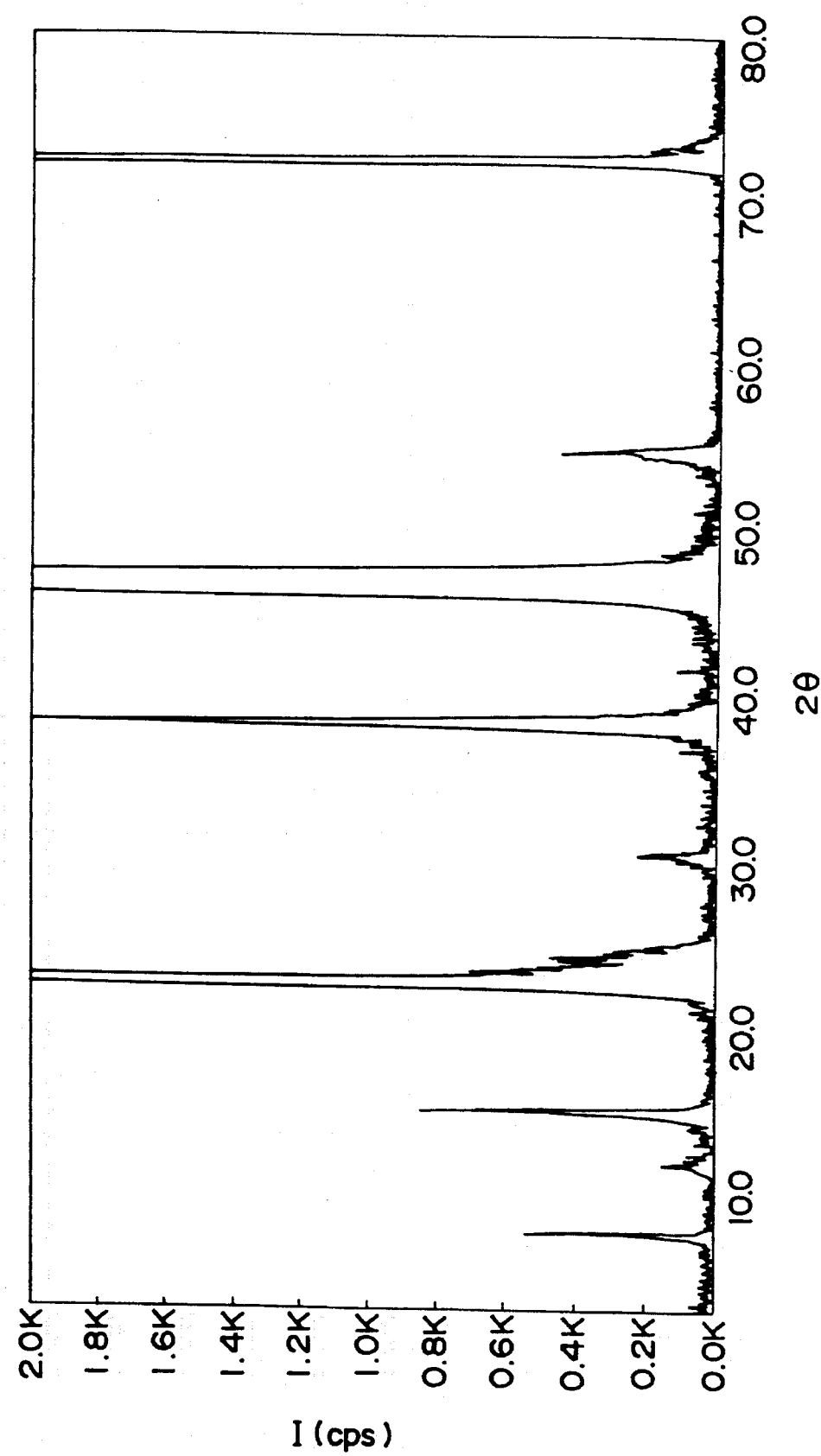
FIG. 3 is an X-ray diffraction pattern of a metal oxide layer of a conventional composite material.

From the X-ray diffraction patterns shown in FIGS. 2 and 3, it will be appreciated that the diffraction peaks in FIG. 2 are much sharper than those in FIG. 3, suggesting that the crystalinity of the thin layer of the composite material of the present invention is excellent.

EXAMPLE 2

On the $YBa_2Cu_3O_{7-x}$ thin layer of the composite material obtained in Example 1 was further formed a thin layer of $PrBa_2Cu_3O_{7-x}$ by a CVD method.

We claim:

1. A method of producing a composite material comprising a substrate of a Y-series 123 metal oxide crystal, and a layer provided on a surface of said substrate and formed of a crystal of a Y-series 123 metal oxide, said method comprising the steps of:

contacting a seed material with a liquid phase which contains a melt of a mixture of metal oxides and in which a solid phase is present at a position different from the position at which said seed material and said liquid phase contact, said solid phase providing said liquid phase with solutes which constitute said Y-series 123 metal oxide so that said solutes are transported to the position at which said substrate and said liquid phase contact, thereby growing a Y-series 123 metal oxide on said seed material as primary crystals and to thereby provide said substrate; and forming a crystal of a Y-series 123 metal oxide as a layer on said substrate by sputtering, vacuum deposition, laser abrasion or chemical vapor deposition.

2. A method as claimed in claim 1, wherein said seed material is vertically pulled at a rate of 0.01–10 mm per hour.

3. A method as claimed in claim 1, wherein said seed material is allowed to quiescently immersed in said liquid phase while gradually cooling said liquid phase.

4. A method as claimed in claim 1, further comprising forming at least one additional layer over said layer.

5. A method as claimed in claim 4, wherein said forming of said at least one additional layer is by a sputtering method, a vacuum deposition method, a laser abrasion method, a chemical vapor deposition method or a liquid phase epitaxy method.

* * * * *